United States Patent [19]

Saito et al.

[11] Patent Number: 5,309,000
[45] Date of Patent: May 3, 1994

[54] DIAMOND FILMS WITH HEAT-RESISTING OHMIC ELECTRODES

[75] Inventors: Kimitsugu Saito; Koji Kobashi; Kozo Nishimura; Koichi Miyata, all of Kobe, Japan

[73] Assignee: Kabushiki Kaisha Kobe Seiko Sho, Kobe, Japan

[21] Appl. No.: 50,614

[22] Filed: Apr. 22, 1993

[30] Foreign Application Priority Data

Apr. 23, 1992 [JP] Japan .................. 4-104766

[51] Int. Cl.⁵ .......................... H01L 23/48
[52] U.S. Cl. ...................... 257/076; 257/77; 257/754; 257/755; 257/756; 423/446; 437/100; 437/186
[58] Field of Search ........... 257/77, 76, 754, 755, 257/756; 423/446; 437/186, 100

[56] References Cited

U.S. PATENT DOCUMENTS

| | | | |
|---|---|---|---|
| 5,002,899 | 3/1991 | Geis et al. | 257/77 X |
| 5,086,014 | 2/1992 | Miyata et al. | 257/77 X |
| 5,173,761 | 12/1992 | Dreifus et al. | 257/77 X |
| 5,210,431 | 5/1993 | Kimoto et al. | 257/77 |

FOREIGN PATENT DOCUMENTS

| | | | |
|---|---|---|---|
| 0445998 | 11/1991 | European Pat. Off. | 257/77 |
| 2252670 | 8/1992 | United Kingdom . | |
| 2260340 | 4/1993 | United Kingdom . | |

*Primary Examiner*—William Mintel
*Attorney, Agent, or Firm*—Oblon, Spivak, McClelland, Maier & Neustadt

[57] ABSTRACT

A is a heat-resisting ohmic electrode on diamond film, including: a p-type semiconducting diamond film; a boron-doped diamond layer provided on the semiconducting diamond film; and an electrode element made of p-type Si selectively formed on the boron-doped diamond layer; wherein the boron concentration in the boron-doped diamond layer is from $1.0 \times 10^{19}$ to $1.8 \times 10^{23}$ cm$^{-3}$, and at least one impurity selected from the group consisting of B, Al and Ga is doped in the electrode element with a concentration from $1.0 \times 10^{20}$ to $5.0 \times 10^{22}$ cm$^{-3}$. The ohmic electrode on diamond film is applicable for electronic devices operative at high temperature.

3 Claims, 5 Drawing Sheets

DIAMOND FILMS WITH HEAT-RESISTING OHMIC ELECTRODES

BACKGROUND OF THE INVENTION

1. Field of the Invention

The present invention relates to semiconducting diamond films with heat-resisting ohmic electrodes applicable for electronic devices which can be used at high temperature, and to fabrication method for such films.

2. Description of the Related Art

Diamond has a high hardness and a high thermal conductivity, an excellent heat resistance and a high stability against radiation and chemicals. Recently, it has become possible to synthesize diamond films by chemical vapor deposition process (hereinafter, referred to as CVD process). Diamond films thus formed are used as a coating material for speaker diaphragm coatings and heat sinks for integrated circuits and the like.

Diamond is insulating in the undoped state; however, it is p-type semiconductor if boron (B) is doped. The semiconducting diamond has a large band gap (about 5.4 eV) so that its semiconducting properties are not deteriorated even at high temperatures of several hundreds °C. Therefore, semiconducting diamond films are expected to be used as a material for electronic devices operative at high temperatures, which is not possible for devices made using traditional semiconducting materials such as Si, SiC, GaAs or the like.

To apply semiconducting diamond films to electronic devices at high temperatures, it is necessary to establish a technology for forming ohmic electrodes with a good adhesion and an excellent heat resistance on the surfaces of semiconducting diamond films. Conventionally, ohmic electrodes have been made of metallic films for semiconducting diamond film electronic devices.

FIG. 5 is a cross sectional view showing an electronic device (thermistor) with the prior art ohmic electrodes (Abstract of the Fifth Diamond Symposium, p. 114, 1991). Here, a diamond film 12 without impurity doping (hereinafter, referred to as undoped diamond film) was selectively formed on a substrate 11. A boron doped diamond film 13 (hereinafter, referred to as B-doped diamond film) was then selectively formed on the undoped diamond film 12. A pair of electrodes 14, made of a bilayer of a Ti film 14a and an Au film 14b, were formed on the doped diamond film 13 in such a manner as to be spaced apart from each other. Here, the Ti film 14a and the Au film 14b had been sequentially deposited on the B-doped diamond film 13, followed by annealing. It was found that a TiC layer, formed at the interface between the B-doped diamond film 13 and the electrodes 14, is responsible to obtain ohmic electrodes with a good adhesion.

It should be noted that Ti has a strong affinity to oxygen, and is easily oxidized in air. In order to prevent the oxidation of the Ti film 14a, the Au film 14b is formed on the Ti film 14a as a protective film.

FIG. 6a is a cross sectional view showing an electronic device (thermistor) having other ohmic electrodes according to the prior art; and FIG. 6b is a partially enlarged view showing the portion of the ohmic electrodes of FIG. 6a (NEW DIAMOND Vol. 5, No. 2, p. 32, 1989). Here, a B-doped diamond film 22 was formed on a $Si_3N_4$ substrate 21. A pair of electrodes 23 are formed by sequentially depositing a Ti film 23a, a Mo film 23b and a Au film 23c on the B-doped diamond film 22 in such a manner as to be spaced apart from each other. Further, a protective film 24 made of $SiO_2$ is provided between the electrodes 23 on the B-doped diamond film 22 in such a manner as to be slightly extended on the electrodes 23. Lead wires 25 made of Ni are connected to the electrodes 23 at the positions not to be covered with the protective film 24.

The above-mentioned semiconducting electronic devices using the prior art of semiconducting diamond films, however, have a disadvantage that they cannot be used at high temperatures. Namely, as shown in FIG. 5, in the Ti-Au bilayer of electrodes 14, Ti diffuses rapidly into Au at a temperature of 500° C., thereby causing an oxidation of Ti at the surface of the Au film 14a. Accordingly, the ohmic electrodes with such a structure as shown in FIG. 5 tend to be oxidized and hence deteriorated at high temperatures.

If a Mo film 23b is provided between the Ti film 23a and the Au film 23c as shown in FIGS. 6(a) and 6(b), it appears to be possible to prevent the mutual diffusion between Ti and Au, hence to solve the above problem. However, the thermal expansion coefficients of Ti, Mo and Au are significantly larger than diamond. Therefore, if the Ti/Mo/Au electrodes are used in an environment in which the temperature rise and drop are frequently repeated, there occurs a problem that the electrodes are cracked or partially peeled off.

SUMMARY OF THE INVENTION

It is therefore an object of the present invention to provide heat-resisting ohmic electrodes on diamond films, applicable for electronic devices used at high temperatures. The ohmic electrodes of the present invention exhibit excellent ohmic characteristics without generation of peeling and cracking of the electrodes.

According to a first aspect of the present invention, there is provided a heat-resisting ohmic electrode on a diamond film, comprising: a p-type semiconducting diamond film; a boron-doped diamond layer provided on the semiconducting diamond film; and an electrode element made of a p-type Si selectively formed on the boron-doped diamond layer; wherein the boron concentration in the boron-doped diamond layer ranges from $1.0 \times 10^{19}$ to $1.8 \times 10^{23}$ cm$^{-3}$, and in the electrode element at least one element selected from a group consisting of B, Al and Ga is doped with a concentration from $1.0 \times 10^{20}$ to $5.0 \times 10^{22}$ cm$^{-3}$.

Further, according to a second aspect of the present invention, there is provided a method of fabricating a heat-resisting ohmic electrode on a diamond film, comprising the steps of: doping boron on the surface of a p-type semiconducting diamond film with a concentration from $1.0 \times 10^{19}$ to $1.8 \times 10^{23}$ cm$^{-3}$ to form a boron-doped diamond layer; and selectively forming an electrode element made of p-type Si on the boron-doped diamond layer.

In the present invention, the electrode is p-type Si. As shown in Table 1, Si has a smaller thermal expansion coefficient than Mo, Ti and Au. Its value is only slightly different from the value of diamond. Furthermore, Si is a covalent bond material as is diamond, so that the electrode element made of Si has an excellent adhesion to diamond films. Therefore, even by repeating temperature cycles, the peeling and cracking of the electrode can be avoided.

Further, while the oxidation Si develops in air at high temperature, the thickness of the oxidized Si layer is very small. Therefore, the electrode element made of Si has no risk of being deteriorated by oxidation.

TABLE 1

| Material | Coefficient of linear expansion (°C$^{-1}$) |
| --- | --- |
| diamond | $0.8 \times 10^{-6}$ |
| Si (silicon) | $2.6 \times 10^{-6}$ |
| Mo (molybdenum) | $5.0 \times 10^{-6}$ |
| Ti (titanium) | $8.5 \times 10^{-6}$ |
| Au (gold) | $14.2 \times 10^{-6}$ |

For the electrode made of p-type Si, if the concentration of the impurities (at least one impurity selected from a group consisting of B, Al, and Ga) is less than $1.0 \times 10^{20}$ cm$^{-3}$, the resistivity is higher than $1 \times 10^{-3} \Omega \cdot$cm, thereby it is impossible to obtain an ohmic contact. Therefore, the impurity concentration in the electrode element made of p-type Si must be greater than $1.0 \times 10^{20}$ cm$^{-3}$ and less than $5.0 \times 10^{22}$ cm$^{-3}$ which corresponds to the atomic density of Si in bulk silicon. With this arrangement, it is possible to obtain electrodes with excellent ohmic characteristics, low resistance, and which are stable at high temperatures. Preferably, the impurity concentration of the electrode element made of p-type Si should be as high as possible within the above range.

The boron-doped diamond layer (p+layer), which contains an activated boron concentration higher than $1.0 \times 10^{19}$ cm$^{-3}$, is strongly degenerated. Therefore, the depletion layer formed at the interface between the electrode and the boron-doped diamond layer is so narrow that carriers can easily travel between the electrode and the boron-doped diamond layer by tunneling effect. This makes it possible to obtain ohmic characteristics with a small contact resistance. Consequently, the boron concentration in the boron-doped diamond layer must be in the range from $1.0 \times 10^{19}$ cm$^{-3}$ to $1.8 \times 10^{23}$ cm$^{-3}$. Preferably, the boron concentration should be as high as possible within the above range.

According to the present invention, the p+layer may be formed at the surface of the semiconducting diamond film by vapor-phase synthesis, ion implantation or the like. A diamond layer with a high boron concentration can be deposited at the surface areas of a p-type semiconducting diamond layer where the electrodes are to be formed by vapor-phase synthesis. Alternatively, B ions can be implanted at the surface areas of the p-type semiconducting diamond film where electrodes are to be formed. In this area, the boron concentration at the surface increases and at the same time, interfacial levels are densely created as lattice defects. The interfacial levels make it possible for carriers to move without any barrier between the semiconducting diamond film and the electrode.

B-doped diamond films formed by vapor-phase synthesis have better reproducibilities in their electric characteristics in the temperature cycles (R. E. Harper, C. Johnston, N. G. Blamires, P. R. Chalker and I. M. Buckley-Golder, Surface and. Coatings Technology, vol. 47, p. 344 (1991)). By heat treatment of the surface areas of the p-type semiconducting diamond film, where boron ions have been implanted at high concentrations, the lattice defects generated due to ion implantation are annealed to recover a better crystallinity, and the boron atoms implanted are activated as acceptors. Therefore, it is preferred to heat treat the specimen, after the B-doped diamond layer has been formed at the surface of the diamond film by vapor-phase synthesis or ion implantation, at a temperature of from 300° to 1200° C.

BRIEF DESCRIPTION OF THE DRAWINGS

The above and other objects, features and advantages of the present invention will be more apparent from the following description taken in connection with the accompanying drawings, in which:

FIG. 6b is a partially enlarged view showing the electrode portions of FIG. 6a.

DETAILED DESCRIPTION OF THE PREFERRED EMBODIMENTS

Hereinafter, the preferred embodiments of the present invention will be described with reference to the accompanying drawings.

Figure 1:
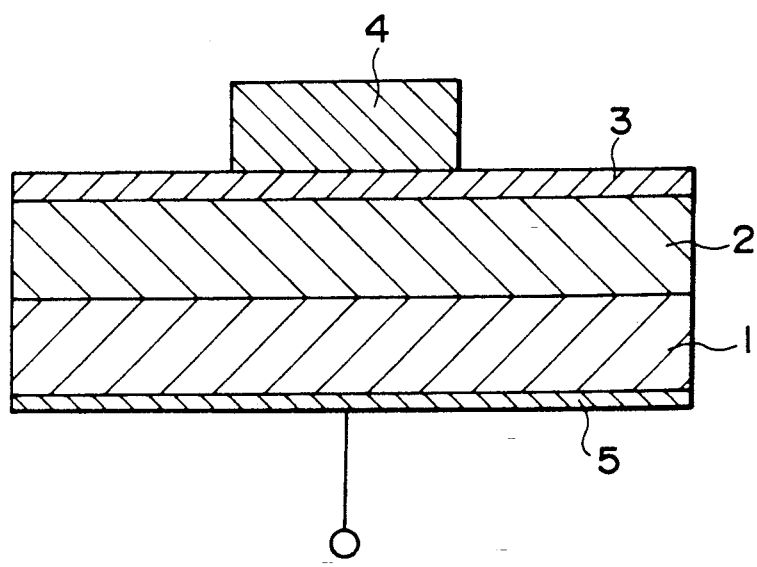
FIG. 1 is a cross sectional view showing a diamond film with a heat-resisting ohmic electrode according to an embodiment of the present invention.

FIG. 1 is a cross sectional view showing a diamond film with a heat-resisting ohmic electrode according to an embodiment of the present invention.

In FIG. 1, a B-doped diamond film 2 is formed on a p-type Si substrate 1. A high concentration B-doped layer 3 is provided on the surface of the B-doped diamond film 2. The high concentration B-doped layer 3 has been doped with boron with a concentration of $1.0 \times 10^{19}$ to $1.8 \times 10^{23}$ cm$^{-3}$. Also, an electrode element 4 made of p-type polycrystalline Si is provided on the high concentration B-doped layer 3. The electrode element 4 is doped with at least one element selected from a group consisting of B, Al and Ga with a concentration of $1.0 \times 10^{20}$ to $5.0 \times 10^{22}$ cm$^{-3}$. In addition, a copper plate as an ohmic electrode 5 is bonded to the back surface of the p-type Si substrate 1.

In this embodiment, since the electrode element 4 comprises p-type Si, the difference in the thermal expansion coefficients between the electrode element 4 and the diamond film 2 is very small. Therefore, the peeling and cracking of the electrode element 4 due to temperature cycles can be avoided.

Since the high concentration boron-doped layer 3 on the surface of the diamond film 2 is doped with boron of $1.0 \times 10^{19}$ to $1.8 \times 10^{23}$ cm$^{-3}$, and the electrode element 4 is doped with impurities such as B, Al and Ga of $1.0 \times 10^{20}$ to $5.0 \times 10^{22}$ cm$^{-3}$, an ohmic contact is achieved.

Next, a method of fabrication a diamond film with a heat-resisting ohmic electrode according to the above-described embodiment of the present invention will be described:

First, a B-doped diamond film 2 is formed on a p-type Si substrate 1 by CVD process or the like. Subsequently, B ions are implanted at the surface of the B-doped diamond film 2 by ion implantation to form a high concentration B-doped layer 3. The B concentration in the B-doped layer 3 is in the range from $1.0 \times 10^{19}$ to $1.8 \times 10^{23}$ cm$^{-3}$. The boron atoms implanted in the B-doped layer 3 are activated by a heat treatment at a temperature between 300° and 1200° C., and the crystal defects therein are reduced thereby to recover the crystallinity at the surface of the B-doped layer 3.

Next, a polycrystalline Si film is formed on the high concentration B-doped layer 3. The Si film is then implanted with B ions or the like, and is subjected to a heat treatment, thus forming a conductive Si film doped with B at a concentration from $1.0 \times 10^{20}$ to $5.0 \times 10^{22}$ cm$^{-3}$. Subsequently, the conductive Si film is etched in a specified pattern using photolithography to thus form the electrode element 4.

Finally, a copper plate as an ohmic electrode 5 is bonded to the back surface of the Si substrate 1. Thus, the diamond film with a heat-resisting ohmic electrode as shown in FIG. 1 is completed.

The present invention will be more clearly understood by way of the following examples.

WORKING EXAMPLE 1

First, a low resistance p-type Si substrate 1 (size: 20 mm × 10 mm) with a resistivity of less than 0.01Ω·cm was buffed for 1 hour with a diamond paste.

A B-doped diamond film 2 was deposited on the p-type Si substrate 1 to a thickness of about 4 μm by microwave CVD. For the source gas, 0.5% methane in hydrogen and 1.0 ppm diborane ($B_2H_6$) were used. In the film growth, the substrate temperature was 800° C., the gas pressure was 35 Torr, and the deposition time was 14 hours.

B ions were then implanted at the surface of the B-doped diamond film 2 by ion implantation under the following conditions: the accelerating voltage was 50 kV, and the implantation density was $1.0 \times 10^{14}$ cm$^{-2}$. Thus, the B-doping concentration in the high concentration B-doped layer 3 became $1.0 \times 10^{19}$ cm$^{-3}$.

The high concentration B-doped layer 3 was subjected to a heat treatment at 950° C. for 30 minutes in vacuum, to activate the dopant therein. A graphite layer generated on the surface of the diamond by the heat treatment was removed by cleaning with a mixture of chromic acid and concentrated sulphuric acid, and the impurities on the surface were removed by acqua regia cleaning and RCA cleaning.

Next, an amorphous Si film of 1 μm thick and a $SiO_2$ film of 0.2 μm thick were sequentially deposited on the high concentration B-doped layer 3 by sputtering.

By a heat treatment at 950° C. for 60 minutes in vacuum, the above amorphous Si film became polycrystalline. The polycrystalline Si film was then doped with B by ion implantation under the following conditions: the accelerating voltage was 200 kV and the implantation density was $1.0 \times 10^{16}$ cm$^{-2}$. Thus, the B concentration in the high concentration B-doped layer 3 became $1.0 \times 10^{20}$ cm$^{-3}$.

After a heat treatment at 950° C. for 60 minutes in vacuum, the above $SiO_2$ film was removed by HF. Then, the above polycrystalline Si film was selectively etched by lithography to form a p-type polycrystalline Si electrode element 4 of 1 μm thick and 100 μm in diameter.

Subsequently, a copper plate was bonded to the back surface of the p-type Si substrate 1 to form an ohmic electrode 5. Thus, a sample (diamond with an electrode) in Example 1 was completed.

COMPARATIVE EXAMPLE 1

The sample in this Comparative example 1 was made in the same manner as in Example 1, except that the ion implantation density of B in formation of the B-doped layer 3 was $9.0 \times 10^{13}$ cm$^{-2}$. The B concentration in the high concentration B-doped layer 3 of the sample was $9.0 \times 10^{18}$ cm$^{-3}$.

COMPARATIVE EXAMPLE 2

The sample in this Comparative example 2 was made in the same manner as in Example 1, except that the ion implantation density of B in formation of the B-doped layer 3 was $9.0 \times 10^{15}$ cm$^{-2}$. The B concentration in the Si electrode element 4 of this sample was $9.0 \times 10^{19}$ cm$^{-3}$.

The samples in Working example 1 and Comparative examples 1 and 2 were examined using the current-voltage characteristic measurements (I-V characteristic).

Figure 2:
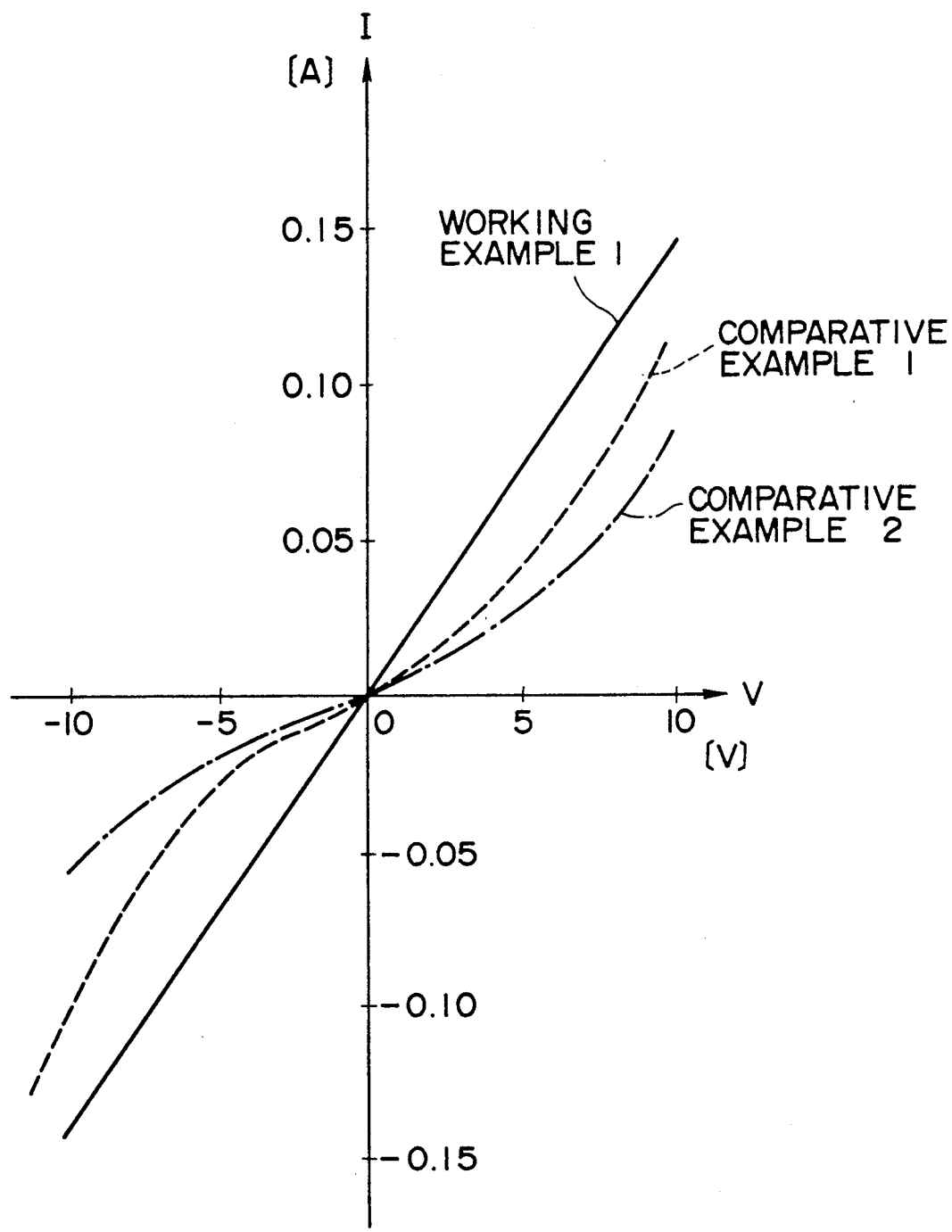
FIG. 2 is a graph showing the I-V characteristics of the samples in Working example 1 and Comparative examples 1 and 2 at room temperature.
Figure 3:
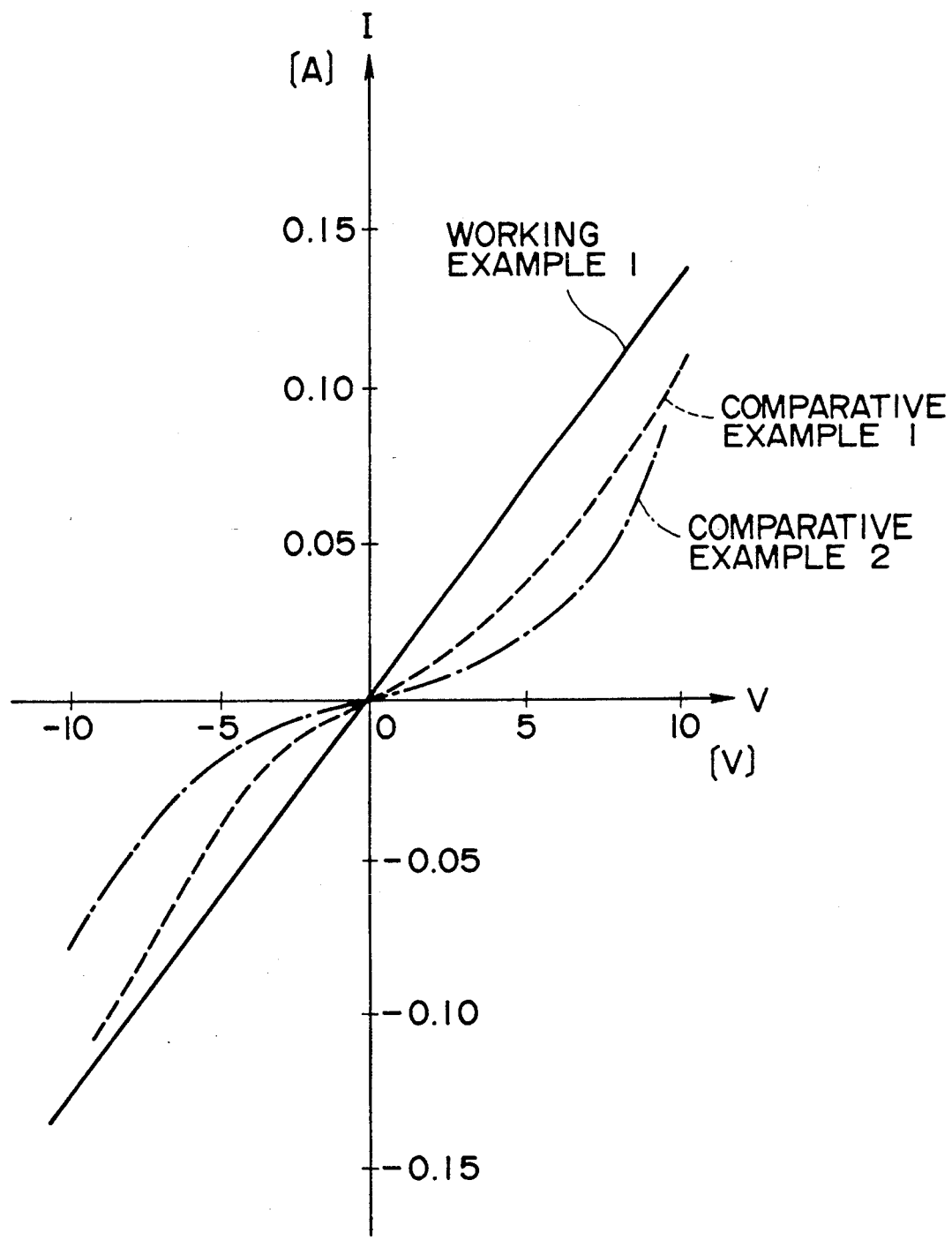
FIG. 3 is a graph showing the I-V characteristics of the samples in Working example 1 and Comparative examples 1 and 2 at 600° C. in air.
Figure 4:
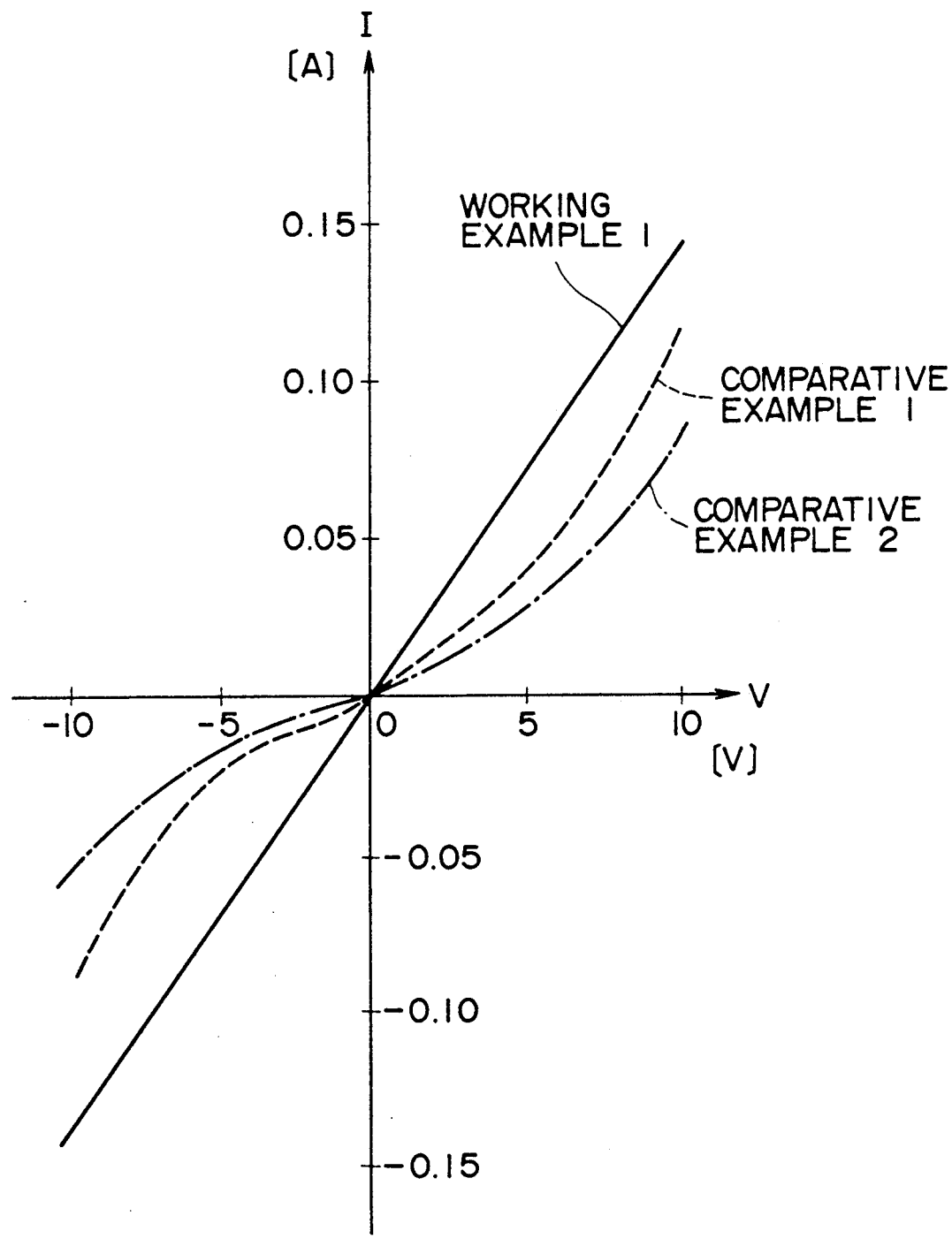
FIG. 4 is a graph showing the I-V characteristics at room temperature of the samples in Working example 1 and Comparative examples 1 and 2 which have been kept at a temperature of 600° C. for 3 hrs in air.
Figure 5:
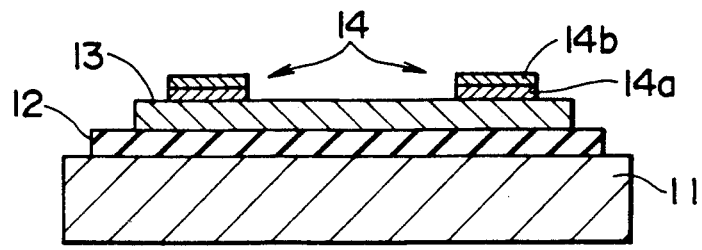
FIG. 5 is a cross sectional view showing an electronic device (thermistor) with the ohmic electrodes of the prior art.
Figure 6A:
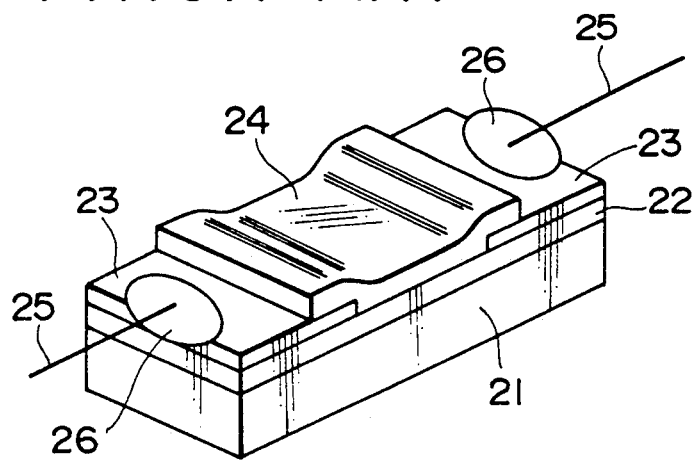
FIG. 6a is a cross sectional view showing an electronic device (thermistor) with other ohmic electrodes.
Figure 6B:
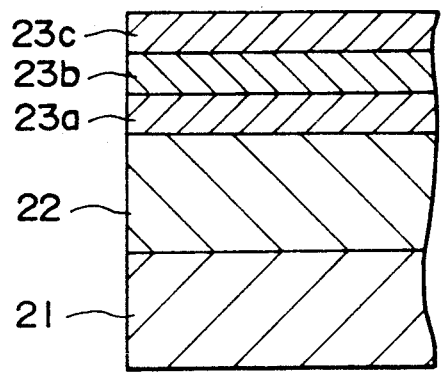

FIG. 2 is a graph showing I-V characteristics of the samples Working example 1 and Comparative examples 1 and 2 at room temperature. In this figure, the abscissa indicates the applied voltage and the ordinate indicates the current value. FIG. 3 is a graph showing I-V characteristics of the samples in Working example 1 and Comparative examples 1 and 2 at 600° C. in air. FIG. 4 is a graph showing the I-V characteristics at room temperature of the samples in Working example 1 and Comparative examples 1 and 2 which have been kept at 600° C. in air for 3 hours.

As shown in these figures, the sample in Working example 1 has a linear I-V characteristic in either of the above conditions, showing excellent ohmic characteristics. In Working example 1, even by repeating temperature cycles for 10 times between room temperature and 600° C., peeling and cracking of the electrode element 4 did not occur. In contrast, in Comparative examples 1 and 2, the I-V characteristics became S-shape, indicating non-ohmic characteristics.

WORKING EXAMPLE 2

First, a B-doped diamond film was deposited on a p-type Si substrate in the same manner as Working example 1.

Next, a high concentration B-doped diamond layer of 0.2 μm thick was formed on the surface of the B-doped film by microwave CVD process. For the source gas, 0.5% methane in hydrogen and 5.0 ppm $B_2H_6$ were used. In the film deposition, the substrate temperature was 800° C., the gas pressure was 35 Torr, and the deposition time was 1 hour. The B-doping concentration of the resulting B-doped diamond layer was $1.0 \times 10^{19}$ cm$^{-3}$.

After annealing at 500° C. for 1 hour in vacuum, a graphite layer generated at the surface of the diamond by the heat treatment was removed by cleaning with a mixture of chromic acid and concentrated sulphuric acid, and the impurities on the surface was removed by acqua regia cleaning and RCA cleaning.

Subsequently, a B-doped diamond amorphous Si semiconducting film of 1 μm thick was formed on the high concentration B-doped layer by radio-frequency plasma CVD process. A mixed gas of 1% $SiH_4$ and $H_2$ was used as a reaction gas. As a doping gas, a 0.5% $B_2H_6$ gas was used. In the film deposition, the substrate temperature was 80° C., the gas pressure was 0.25 Torr, and the deposition time was 4 hours. Thus, the B-doping concentration in the resulting amorphous Si film was $1.0 \times 10^{20}$ cm$^{-3}$.

A $SiO_2$ film was then formed on the above amorphous Si film to a thickness of 0.2 μm by sputtering.

The above amorphous Si film was converted to a polycrystalline film by annealing at 950° C. for 1 hour in vacuum. The above $SiO_2$ film was then removed by HF, and the above polycrystalline Si film was etched by lithography to form a p-type polycrystalline electrode of 1 μm thick and 100 μm in diameter.

Subsequently, a copper plate was bonded to the back surface of the p-type Si substrate 1 to form an ohmic electrode element 5. Thus, a sample in Working example 2 was completed.

The I-V characteristics of Working example 2 showed an excellent ohmic nature just as Working example 1. By temperature cycles, peeling and cracking of the electrode never occurred.

As described above, in the diamond film with a heat-resisting ohmic electrode according to the present invention, a boron-doped layer of a specified concentration is provided on the surface of the p-type semiconducting diamond film, and an electrode element made of p-type Si is formed on the boron-doped layer. Accordingly, it is possible to achieve excellent ohmic characteristics, and to prevent peeling and cracking of the electrode even by repeated temperature cycles. Consequently, the present invention is significantly useful for diamond electronic devices used at high temperature.

Also, in the fabrication method of the present invention, boron is doped at the surface of the p-type semiconducting diamond film in a specified amount to form a boron doped layer, and the electrode element made of p-type Si is selectively formed on the boron-doped layer. Accordingly, it is possible to achieve heat-resisting ohmic electrodes on diamond films, having the above structure.

What is claimed is:

1. A heat-resisting ohmic electrode on diamond film, comprising:
    a p-type semiconducting diamond film;
    a boron-doped diamond layer provided on said semiconducting diamond film; and
    an electrode element made of a p-type Si selectively formed on said boron-doped layer;
wherein boron is doped in said boron-doped diamond layer with a concentration from $1.0 \times 10^{19}$ to $1.8 \times 10^{23}$ cm$^{-3}$, and at least one impurity selected from the group consisting of B, Al and Ga is doped in said electrode element with a concentration from $1.0 \times 10^{20}$ $5.0 \times 10^{22}$ cm$^{-3}$.

2. The electrode on diamond film according to claim 1, wherein said boron-doped diamond layer is formed by any one of a vapor-phase synthesis process and an ion implantation process.

3. The electrode on diamond film according to claim 1, wherein said p-type semiconducting diamond film and said boron-doped diamond layer have been annealed at a temperature between 300° to 1200° C. prior to forming said electrode element made of p-type Si.

* * * * *